US010468450B2

(12) United States Patent
Karim

(10) Patent No.: US 10,468,450 B2
(45) Date of Patent: Nov. 5, 2019

(54) APPARATUS FOR RADIATION DETECTION IN A RADIOGRAPHY IMAGING SYSTEM

(71) Applicant: Karim Sallaudin Karim, Waterloo (CA)

(72) Inventor: Karim Sallaudin Karim, Waterloo (CA)

(73) Assignee: DOSE SMART IMAGING, Waterloo, ON (CA)

( * ) Notice: Subject to any disclaimer, the term of this patent is extended or adjusted under 35 U.S.C. 154(b) by 47 days.

(21) Appl. No.: 14/245,200

(22) Filed: Apr. 4, 2014

(65) Prior Publication Data
US 2015/0287760 A1 Oct. 8, 2015

(51) Int. Cl.
H01L 29/04 (2006.01)
H01L 27/146 (2006.01)
H01L 31/0216 (2014.01)
H01L 31/0232 (2014.01)
H01L 31/08 (2006.01)

(52) U.S. Cl.
CPC .. *H01L 27/14663* (2013.01); *H01L 27/14612* (2013.01); *H01L 27/14692* (2013.01); *H01L 31/0216* (2013.01); *H01L 31/02322* (2013.01); *H01L 31/085* (2013.01)

(58) Field of Classification Search
CPC ................................................. H01L 27/14658
See application file for complete search history.

(56) References Cited

U.S. PATENT DOCUMENTS

| 6,342,700 | B1* | 1/2002 | Izumi | H01L 27/14665 250/370.12 |
|---|---|---|---|---|
| 7,615,731 | B2 | 11/2009 | Heiler et al. | |
| 2003/0085340 | A1* | 5/2003 | Street | H01L 27/12 250/208.1 |
| 2007/0108484 | A1* | 5/2007 | Nagamune | B82Y 10/00 257/290 |
| 2007/0269683 | A1* | 11/2007 | Chen | C04B 35/44 428/697 |
| 2008/0067324 | A1* | 3/2008 | Heiler | H01L 27/14658 250/208.1 |

(Continued)

OTHER PUBLICATIONS

Ghanbarzadeh et al., "Low dark current amorphous silicon Metal-Semiconductor-Metal photodetector for digital imaging applications", IEEE Electron Device Letters, Feb. 2014, pp. 235-237, vol. 35, No. 2, IEEE.

*Primary Examiner* — Moazzam Hossain
*Assistant Examiner* — Hajar Kolahdouzan
(74) *Attorney, Agent, or Firm* — Gowling WLG (Canada) LLP; Jeffery W. Wong

(57) ABSTRACT

This disclosure is directed at a photoconductive element for a digital X-ray imaging system which consists of a detector element comprising at least one semiconducting layer for absorbing photons, a first electrode coupled to a surface of said semiconducting layer, a second electrode coupled to a surface of said semiconducting layer, wherein said first electrode and said second electrode are separated horizontally, and at least one of said electrodes is electrically isolated from said semiconducting layer by an insulating layer; a readout circuit element coupled to said detector element; and a dielectric layer between said detector element and said readout circuit element.

20 Claims, 6 Drawing Sheets

(56) References Cited

U.S. PATENT DOCUMENTS

2011/0291210 A1* 12/2011 Batchelder .............. G21H 1/06
  257/429
2012/0038013 A1*  2/2012 Karim ............. H01L 31/022408
  257/432

* cited by examiner (a)

(b)

(a)

(b)

APPARATUS FOR RADIATION DETECTION IN A RADIOGRAPHY IMAGING SYSTEM

FIELD OF THE DISCLOSURE

This invention relates to radiography imaging systems, and more particularly to a photoconductive element that includes a radiation detector element integrated with a readout circuit element in a radiography imaging system.

BACKGROUND OF THE DISCLOSURE

Traditionally, X-ray diagnostic processes record x-ray image patterns on silver halide films. These systems direct an initially uniform pattern of impinging X-ray radiation through the object to be studied, intercept the modulated pattern of X-ray radiation with an X-ray radiation intensifying screen, record the intensified pattern on a silver halide film, and chemically transform the latent pattern into a permanent and visible image called a radiograph.

Radiographs have been produced by using layers of radiation sensitive materials to directly capture radiographic images as modulated patterns of electrical charges. Depending on the intensity of the incident X-ray radiation, electrical charges generated either electrically or optically by the X-ray radiation within a pixelized area are quantized using a regularly arrange array of discrete solid state radiation sensors.

Recently, there has been rapid development of large area, flat panel, digital X-ray imagers for digital radiology using active matrix technologies used in large are displays. An active matrix consists of a two-dimensional array (of which, each element is called a pixel) of thin film transistors (TFTs) made with a large area compatible semiconductor material including among others, amorphous silicon, polycrystalline silicon, sputtered metal oxides, and organics. There are two general approaches to making flat-panel x-ray detectors, direct or indirect. The direct method primarily uses an amorphous selenium photoconductor as the X-ray to electric charge converting layer coupled directly to the active matrix. In the indirect method, a phosphor screen or scintillator (e.g. CsI, GdOS etc) is used to convert X-rays to light photons which are then converted to electric charge using an additional pixel level light sensor fabricated with the TFT on the active matrix array.

In prior art imaging systems, the pixel level light sensor disclosed is a vertical photodiode as taught in U.S. Pat. No. 7,615,731 B2: High fill-factor sensor with reduced coupling. Alternately, a metal-semiconductor-metal (MSM) photoconductor was taught in U.S. Pat. No. 6,373,062 B1: Interdigital photodetector for indirect x-ray detection in a radiography imaging system.

The key challenges with fabricating a vertical photodiode are the modifications required to the thin film transistor fabrication process specifically, thick amorphous silicon layers, specialized p doped contact layer and a complex RIE sidewall etching process to prevent optical crosstalk. These challenges reduce the fabrication yield and drive up the cost of manufacture. The key challenges with fabricating a lateral MSM photoconductor include the high dark currents at higher electric fields and photoresponse non-uniformity due to a non-uniform electric field. In addition, the lateral MSM photoconductor is not space efficient leading to low effective quantum efficiency (EQE). Each of these issues degrades imager performance, which is the key reason why MSM devices are not used in industry today for large area digital X-ray imaging. Accordingly, a need exists for a photodetector for use in flat-panel radiographic detectors that can mitigate the process yield and cost issues with vertical photodiodes while overcoming the dark current, non-uniformity and EQE device performance limitations in the MSM structures.

SUMMARY OF THE INVENTION

The present invention meets this need and provides system and method aspects for a novel photoconductive element. The photoconductive element consists of a lateral Metal-Insulator-Semiconductor-Insulator-Metal (or MISIM) detector element coupled to a readout circuit element through a via in a dielectric layer that sits between the detector element and readout circuit element. The MISIM detector element comprises a semiconducting layer to absorb incident photons and two electrodes coupled to the semiconducting layer separated in the horizontal plane, where at least one of the electrodes is electrically isolated from the semiconducting layer using an insulator. The insulated contact, also typically under high voltage bias, maintains a low dark current even under high electric field conditions. Applying the high electric field enables the MISIM detector element to operate at a faster speed than conventional metal-semiconductor-metal (MSM) photoconductor designs and also to increase the collection efficiency (and hence EQE) of the electron hole pairs created by the photons impinging on the semiconducting layer. However, the presence of a high bias voltage near the readout circuit can lead to lower reliability and higher dark currents in the photoconductive element and requires use of a dielectric to yield a novel integrated photoconductive element design. The structure of the present invention is simpler and correspondingly less expensive to manufacture in comparison to a traditional photodiode structure. Moreover, unlike traditional MSM photoconductors, the structure of the present invention yields higher performance because the readout circuit element can be embedded under the MISIM detector element yielding a larger area for light absorption. Moreover, the entire photoconductive element can be realized in a large area TFT display manufacturing process, which is more reliable and easier to access than the specialized process for a PIN photodiode. These and other advantages of the aspects of the present invention will be understood in conjunction with the following detailed description and accompanying drawings.

Some of the ideas behind the MISIM detector element, which led to this invention, is described in the following article: (1) S. Ghanbarzadeh, S. Abbaszadeh and K. S. Karim, "Low dark current amorphous silicon Metal-Semiconductor-Metal photodetector for digital imaging applications", IEEE Electron Device Letters (2014). However, the inventive aspects of the implementation of the complete photoconductive element (i.e. with the readout circuit element) for large area digital radiography are not described and form the basis of the present application.

DETAILED DESCRIPTION

The present invention relates to a novel photoconductive element that includes a MISIM detector element integrated with a readout circuit element for a radiography imaging system. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be merely limited to the embodiment shown but is to be accorded the widest scope consistent with the principles and features described herein.

Figure 1:
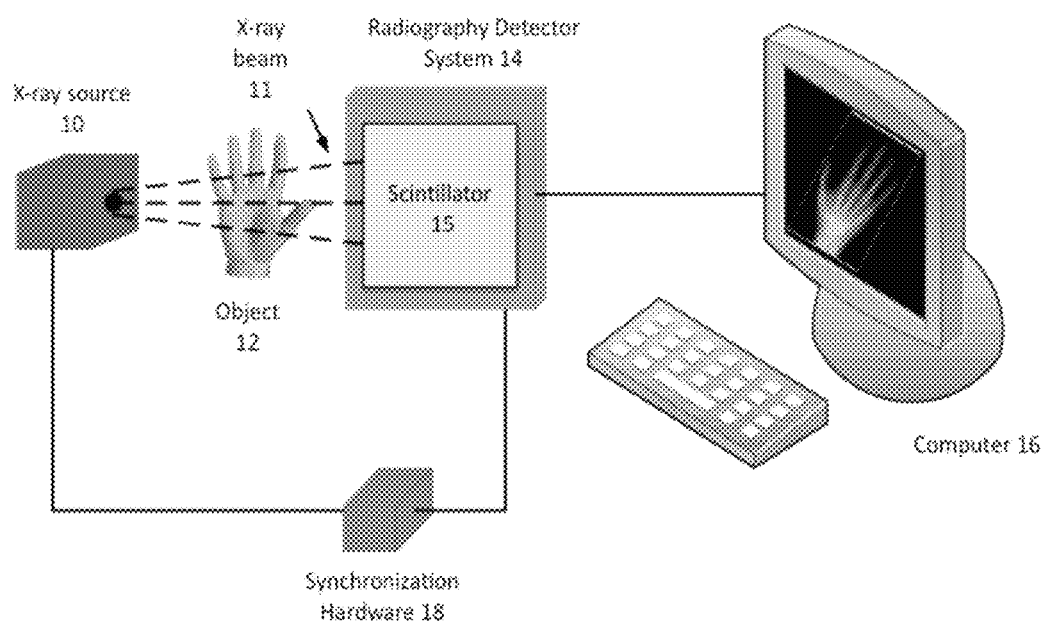
FIG. 1 illustrates a general diagram of a radiographic imaging environment in accordance with the present invention.

FIG. 1 illustrates a general diagram of a radiographic imaging environment in accordance with the present invention. As shown, an X-ray source 10 generates an X-ray beam 11 that is transmitted toward an object 12, e.g., a patient's hand, for imaging by a radiography detector system 14 and viewing on a Computer 16. For some radiography detector systems 14, synchronization hardware 18 is necessary to get the correct timing between the X-ray source 10 and the radiography detector system 14 that is sampling the impinging X-ray beam 11. In the present invention, the radiography detector system 14 utilizes a large area, flat panel detector based on active matrix technologies to achieve the imaging of object 12. In general, the object 12 to be imaged is positioned between the radiation source 10 and the radiography detector system 14. X-rays, which pass through the object 12 interact with the radiography detector system 14. In direct imaging, the x-rays generate electronic charge within the radiography detector system 14 and there is no need for the Scintillator 15. In indirect imaging, the x-rays generate light photons as they pass through a phosphor screen or Scintillator 15, such as CsI, GOS or CaWO4 (Calcium Tungsten Oxide). These indirectly generated light photons then further generate electronic charge within the radiography detector system 14.

Figure 2:
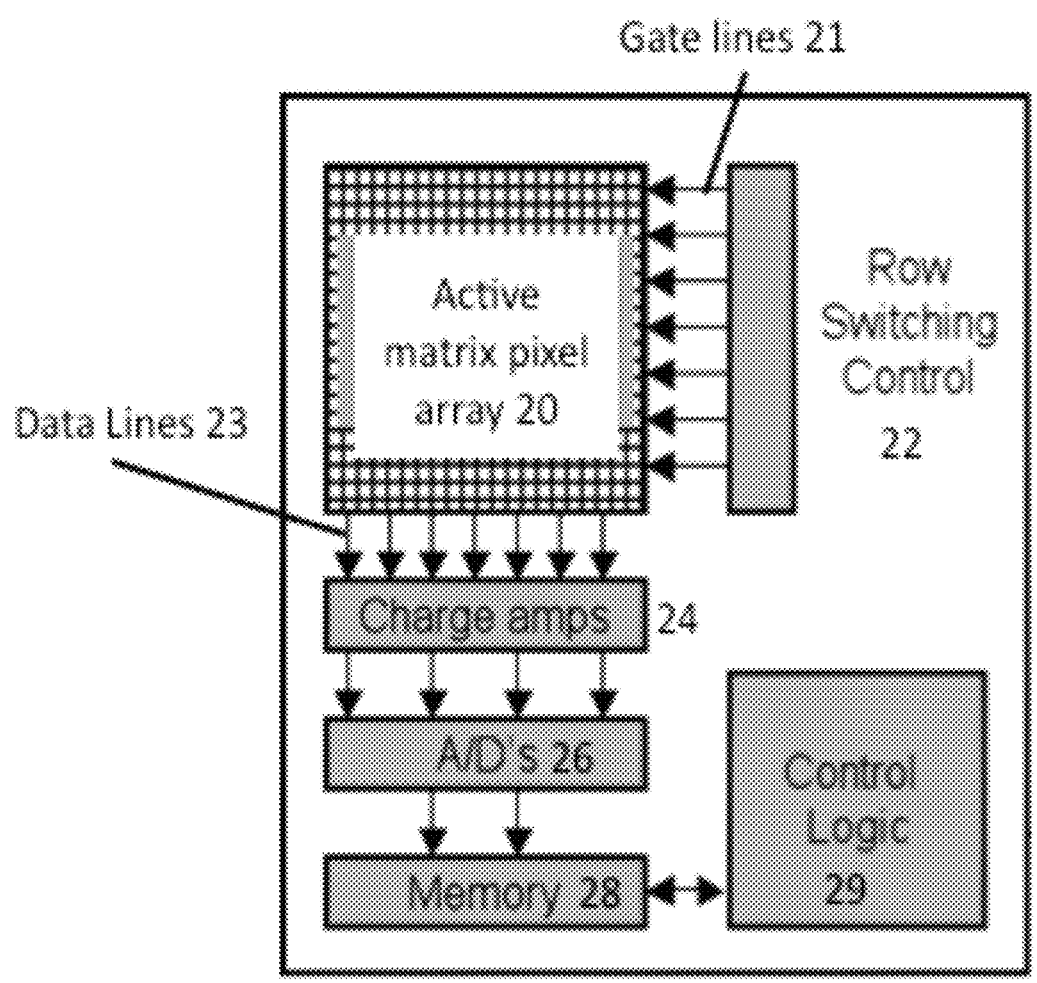
FIG. 2 illustrates a two-dimensional active matrix imaging array structure in accordance with the present invention.

FIG. 2 shows the components of the radiography detector system 14. An active matrix pixel array 20 comprises of a two-dimensional matrix of pixel elements where electronic charges generated directly or indirectly by incident x-rays are sensed and stored. To access the stored charge at each pixel, Gate lines 21 are driven typically sequentially by a Row Switching Control 22 causing all pixels in one row to output their stored charge onto Data lines 23 that are coupled to Charge amplifiers 24 at the end of each active matrix pixel array 20 column. The charge amplifiers 24, that may perform a multiplexing function in addition to their typical amplifying function, send the pixel charge data to analog to digital converters (A/D's) 26, where the analog signal is converted to a digital representation which is then be stored in memory 28 awaiting transmission to the Computer 16 at a time determined by the Control Logic 29.

Figure 3:
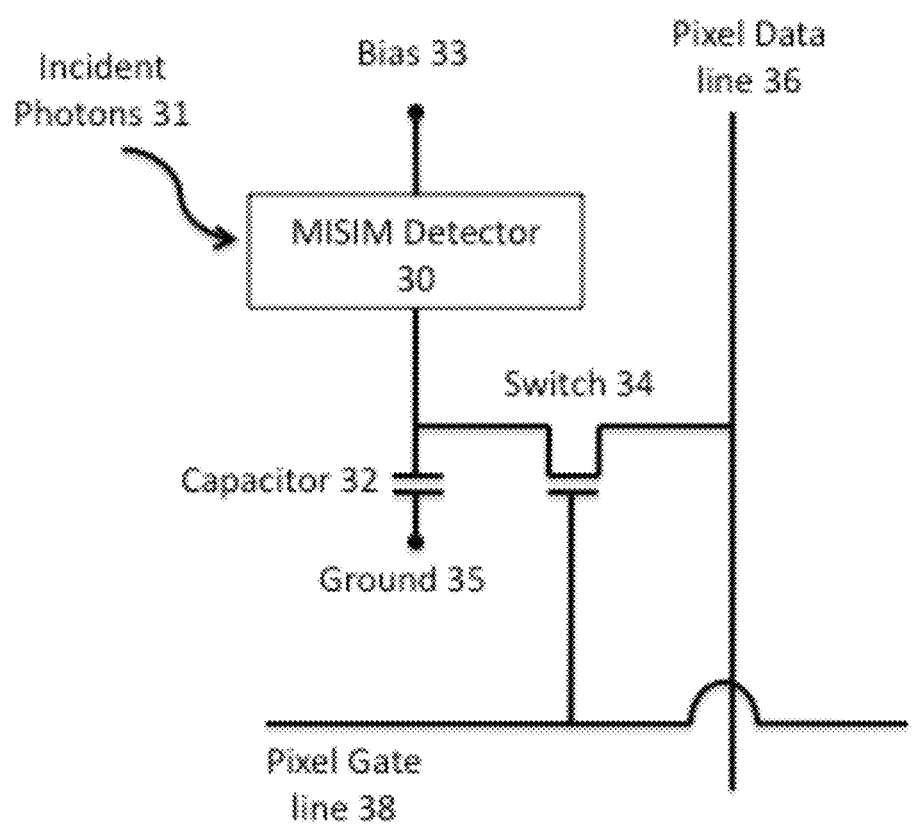
FIG. 3 illustrates a pixel circuit architecture in accordance with the present invention.

FIG. 3 shows the pixel level circuit for one pixel in the active matrix pixel array 20 described in FIG. 2, which typically contains a plurality of pixels. Within each pixel is a two terminal MISIM detector element 30 that absorbs the incident photons and generates electronic charge, a two terminal optional capacitor 32 to stored the converted electronic charge and a readout circuit element, usually a three electrode thin film transistor (TFT) switch 34 as shown for transferring the electronic charge off the pixel. One electrode of the MISIM detector element 30 is connected to a high potential Bias terminal 33 that is shared with other pixels in the active matrix pixel array 20 and one electrode of the Capacitor 32 is connected to a low potential Ground terminal 35 which is also shared with other pixels in the active matrix pixel array 20. The drain electrode of the TFT switch 34 is connected to both, the second electrode of the MISIM detector 30 and the second terminal of the Capacitor 32. The source electrode of the TFT 34 is connected to the Pixel Data line 36, which is coupled to one of the plurality of Data lines 23 described in FIG. 2. The gate electrode of the TFT 34 is connected to the Pixel Gate line 38, which is coupled to one of the plurality of Gate lines 21 described in FIG. 2.

FIG. 4a shows a cross-section of the MISIM detector 30 in a top electrode configuration. In this instance, there is a substrate 40 (typically glass or plastic) with the following layers deposited in sequence: an antireflective layer 42, a semiconducting layer 44, an insulator layer 46 and a patterned contact layer yielding at least two contacts separated horizontally, a bias contact 48 and a sense contact 49. Note that the anti-reflective layer is optional and not necessary for correct working of the MISIM detector 30. However, in indirect conversion imaging, it typically enhances performance by increasing the percentage of light photons impinging on the semiconducting layer 44 where photons are absorbed. In FIG. 4b, a cross-section of the MISIM detector 30 in a bottom electrode configuration is shown. Here the sequence is reversed: first there is the patterned contact layer containing the bias and sense contacts followed by an insulator layer, semiconducting layer and the optional anti-reflective layer.

Dark current is a key problem with traditional MSM detectors because it reduces the detector dynamic range and image quality and is a function of the electric field applied on the bias contact 48. A large electric field is necessary for charge separation of the electronic carriers generated from the impinging photons on the semiconducting layer 44. If photocurrent can be maintained at a high level while dark current is reduced or alternately, a higher electric potential can be applied to the bias contact 48 to increase charge separation efficiency and correspondingly the photocurrent, without increasing the dark current, then a larger photo-to-dark current ratio is possible which equates to better dynamic range, higher contrast, higher quantum efficiencies and better digital images. Neither ohmic nor blocking contacts for the bias 48 and sense 49 contacts have to date been able to achieve the dark current densities necessary for sensitive medical radiography imaging applications (around 10 pA/mm$^2$ or less). In addition, insulating contacts are typically not considered viable because of the anticipated slow response times and the potential for charge build-up on the insulating layer that can lead to reliability concerns.

The present invention uses a specific insulator layer 46 that simultaneously: (1) reduces dark currents when there are no photons impinging on the semiconducting layer 44 and (2) enables high photocurrents when photons impinge on the semiconducting layer 44. To achieve these two goals, the material of the insulator layer 46 must be carefully selected to both, provide a good interface with the semiconducting layer and to have a dielectric strength such that it can be operated in soft (reversible) breakdown during device operation repeatably when the applied bias and insulator layer 46 thickness are optimized to take into account both the dark conductivity and photoconductivity of the semiconducting layer 44 which is also a function of semiconducting layer 44 thickness, applied electric bias and material properties.

When photons are impinging on the semiconducting layer 44 thereby causing the resistivity of the semiconducting layer 44 to decrease, the insulator layer 46 operates in soft (i.e. reversible) breakdown mode allowing a vertical conduction path from bias 48 and sense contacts 49 through the insulator layer 46 to the semiconducting layer 44. Operating in soft breakdown allows for conduction through the insulator layer 46 which can overcome the response time challenge while still maintaining a low dark current by limiting bias 48 and sense 49 contact injection currents. Using an insulator layer 46 that is too thick or with a high dielectric breakdown strength can yield poor results or alternately, choice of an incompatible insulator layer 46 material can yield a poor interface with the semiconducting layer 44 so that traps and defects cause a drop in MISIM detector 30 quantum efficiency.

For example, we determined that using a 450 nm amorphous silicon semiconducting layer 44 works well with a 300 nm polyimide insulator layer 46 and yields a good quality interface with high EQE (above 65%) for green light. Alternately, if high external quantum efficiency is required for blue light, then, for the same amorphous silicon and polyimide material system, the semiconducting layer 44 thickness may need to be reduced which requires a corresponding re-optimization of the insulator layer thickness 46. If the semiconducting layer 44 is changed from amorphous silicon to a metal oxide like IGZO (Indium Gallium Zinc Oxide) or even polysilicon, both of which have different material properties and absorption coefficients, the choice of insulator layer material (for interface purposes), thickness and maximum bias voltage applied need to be re-optimized. Additional improvements in EQE are possible if an optional anti-reflective layer like amorphous silicon nitride is used on top of the semiconducting layer directly in the path of the incident photons.

Figure 4:
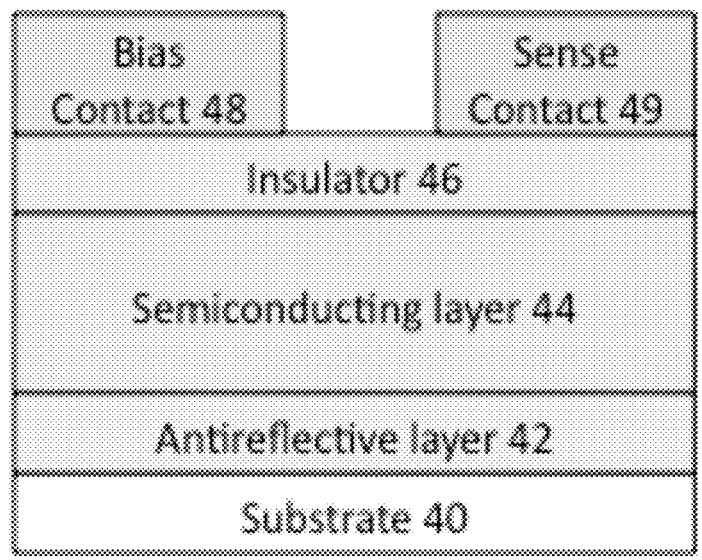
FIG. 4 illustrates a cross-section of a Metal-Insulator-Semiconductor-Insulator-Metal (MISIM) detector element in a top electrode and bottom electrode configuration in accordance with the present invention.
Figure 4:
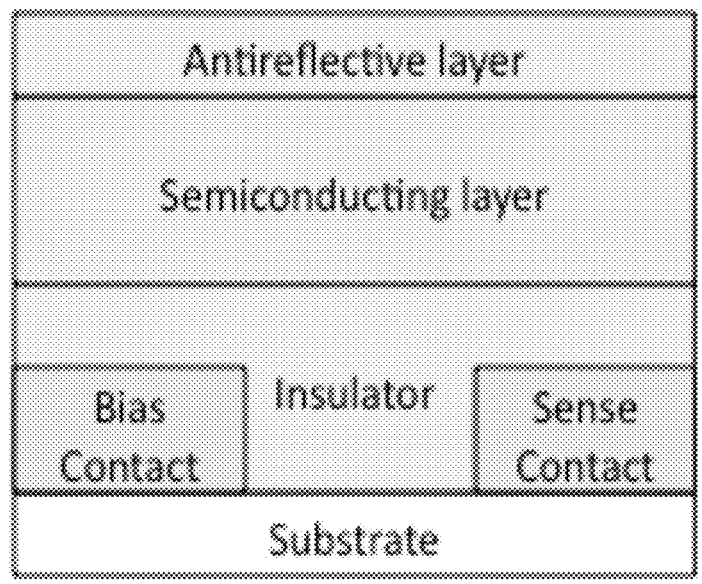

Moreover, it must be noted that it is possible to pattern the insulator layer 46 and use either insulating contacts for both the bias 48 and sense 49 contacts or alternately, use an insulating contact for just one contact (e.g. either for the bias 48 contact or for the sense 49 contact depending on the bias used). A patterning process (e.g. of the bias 48 or sense 49 contacts or the insulator layer 46) can also potentially degrade the semiconducting layer 44 interface because of exposure to air and chemicals during the patterning process. Typically though, as shown in FIG. 4, an insulator layer running across both bias 48 and sense 49 contacts leads to a better overall interface with the semiconductor layer 44 with fewer defects and traps as well as encapsulating the semiconducting layer 44 in the long term thus maintaining higher quantum efficiency. However, MISIM detector elements where only one the bias 48 or sense 49 contacts are insulating remain a feasible alternative if careful semiconductor processing is undertaken. Moreover, it is also possible to place the bias 48 ad sense 49 contacts, one each on opposite sides of the semiconducting 44 layer as long as they are separated by a horizontal distance so that photon absorption and transport remains in the horizontal (lateral) direction. Furthermore, if bias 48 and sense 49 contacts are made using transparent materials, both the top electrode or bottom electrode configuration can detect light photons equally well from either direction.

Figure 5:
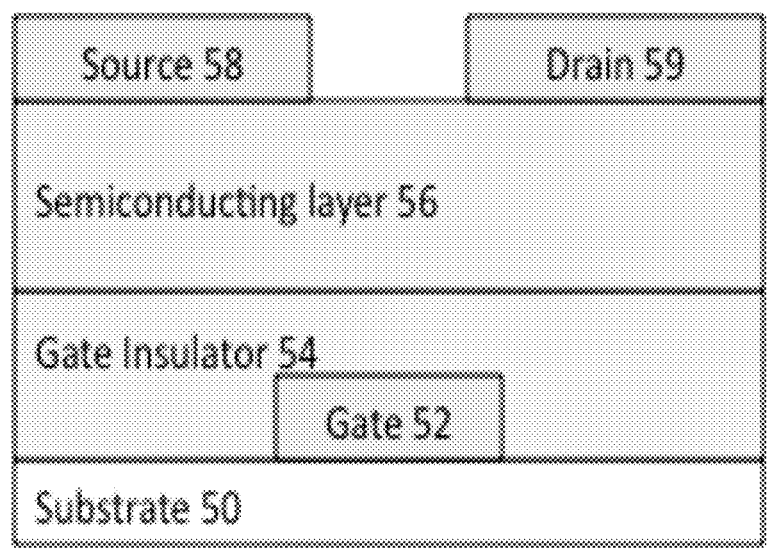
FIG. 5 illustrates a cross-section of a bottom-gate and top-gate thin film transistor (TFT) configuration in accordance with the present invention.
Figure 5:
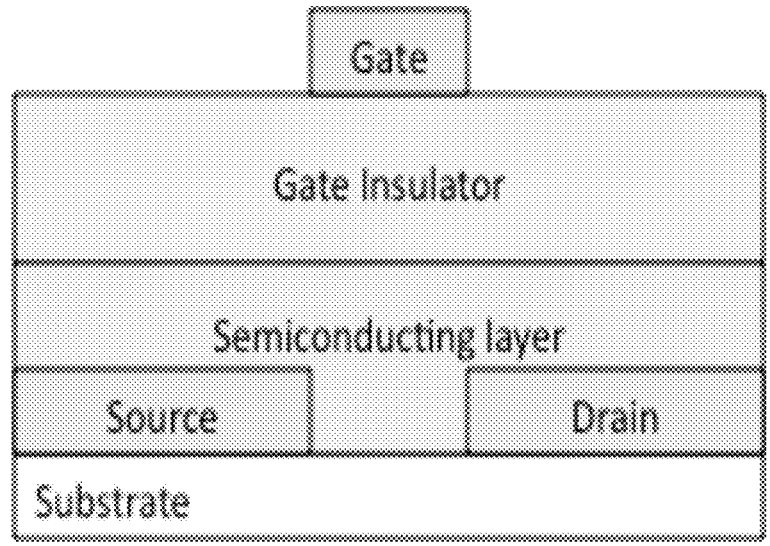

FIG. 5a shows a bottom gate, inverted staggered thin film transistor (TFT) structure where a substrate 50 (e.g. glass or plastic) contains a patterned gate electrode 52, followed by a gate insulator 54, a semiconducting layer 56 and a patterned contact layer defining the source 58 and drain 59 contacts. FIG. 5b shows a top gate, inverted staggered TFT structure with the layers in a reverse configuration. Both are implementations of amorphous silicon TFTs in use by the display industry today. Similar cross-sections can be drawn for CMOS (complementary metal-oxide-semiconductor), IGZO and polysilicon transistors as understood by one skilled in the art.

Figure 6:
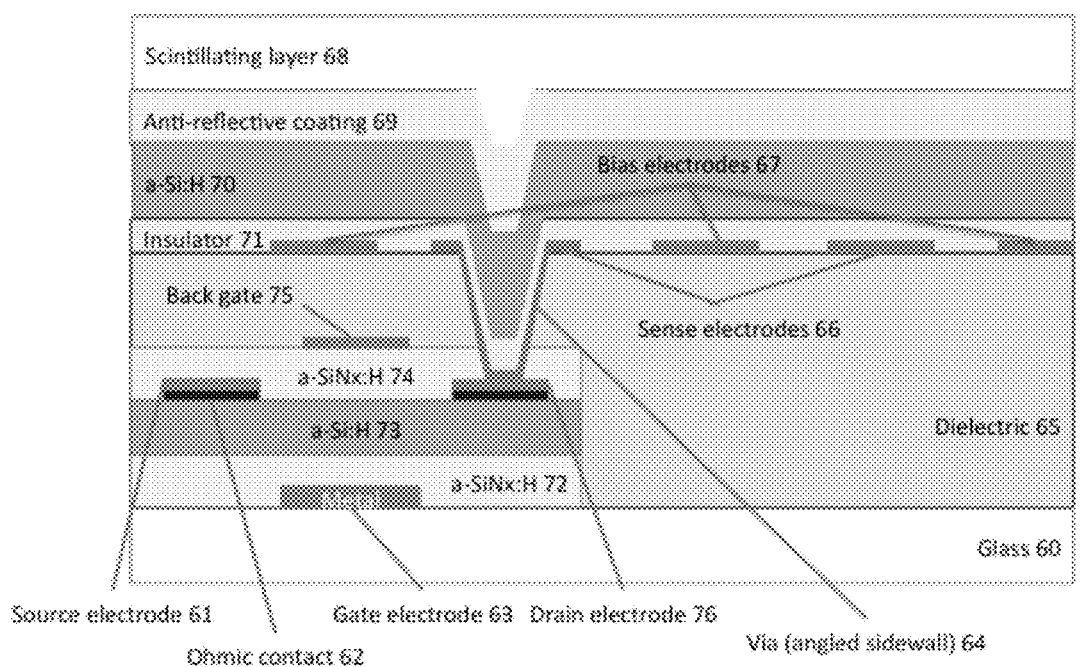
FIG. 6 illustrates a cross-section of a photoconductive element implementation using a MISIM detector element placed on top of a readout circuit element in accordance with the present invention.

FIG. 6 shows a cross-section of a photoconductor element implemented using a readout circuit element embedded physically underneath the amorphous silicon MISIM detector element. The MISIM detector element consists of sense 66 and bias 67 electrodes in a comb configuration, a polyimide insulator layer 71 (or alternately, among others, amorphous silicon nitride, amorphous silicon oxide, amorphous silicon oxynitride, benzocyclobutene (BCB), parylene or polystyrene) that covers both the sense 66 and bias 67 electrodes, an amorphous silicon (a-Si:H) semiconducting layer 70 (or alternately, molybdenum sulphide, Indium Gallium Zinc Oxide, polycrystalline silicon, amorphous selenium, mercuric iodide, lead oxide, microcrystalline silicon, nanocrystalline silicon, crystalline silicon, pentacene, PTCBI, CuPc, small molecule organic semiconductor, or polymer organic semiconductor) and an optional anti-reflective coating layer 69 e.g. amorphous silicon nitride (a-SiNx:H).

The readout circuit element shown employs a bottom gate amorphous silicon TFT acting as a switch. The TFT comprises an amorphous silicon nitride (a-SiNx:H) gate dielectric layer 72, an amorphous silicon (a-Si:H) semiconducting layer 73, an a-SiNx:H 74 passivation layer and a doped ohmic contact layer 62.

Alternately, the readout circuit element could employ a variety of active pixel sensor readout circuits (see, for example, Active pixel sensor for digital imaging, WO 2002067337 A2). Active pixel circuits include as a key element, an on-pixel preamplifier circuit in place of the TFT switch circuit 34 shown in FIG. 3.

The MISIM detector element has a lower intrinsic capacitance than a comparably sized PIN photodiode because this intrinsic capacitance arises between the sense 66 and bias 67 electrodes, which are placed further apart (e.g. 5 um) in contrast to a PIN photodiode (e.g. 1 um). In particular, the lower capacitance of the MISIM detector element (here around 0.2 pF for a 100 micron pixel) as compared to PIN photodiodes (typically around 1 pF for a 100 micron pixel) makes the combination of a MISIM detector element with an active pixel sensor readout element superior in terms of signal-to-noise ratio (SNR). The SNR improvement occurs because the input charge to voltage gain of the MISIM detector element is proportionally higher than if a PIN diode is employed due to the proportionally lower capacitance of the MISIM detector element.

Embedding the readout circuit element underneath the MISIM detector element also has the advantages of maximizing the light absorption area. This becomes more important because active pixel sensor circuits typically use more than one transistor in the readout circuit element in contrast to a switch 34 that requires just one TFT. In WO 2002067337 A2, a three-transistor active pixel sensor circuit is disclosed. Thus, in general, embedding the readout circuit element under the MISIM detector element is beneficial to maximize performance and EQE.

The TFT drain electrode 76 is connected by a via 64 in an interlevel Dielectric 65 to one of the sense electrodes 66 where the dielectric 65 physically separates the MISIM detector element and the readout circuit element. The dielectric can be chosen from a variety of materials including amorphous silicon nitride, amorphous silicon oxide, amorphous silicon oxynitride, polyimide, benzocyclobutene (BCB), parylene, acrylic, and polystyrene.

The choice of the dielectric 65 is important particularly because using a MISIM detector element requires the use of potentially high voltages due to insulating contacts. A high voltage on the bias 67 or sense 66 electrodes can give rise to high vertical electric field between the TFT electrodes (e.g. back gate 75, source 61 or drain 76) leading to local breakdown of the dielectric 65 and catastrophic failure.

However, each material has a different dielectric strength and breakdown voltage and correspondingly requires tuning of layer thickness. This design for high voltage resilience is in addition to the traditional design process undertaken to optimize an interlevel dielectric to serve as a planarization layer and as a low-k dielectric to reduce parasitic coupling capacitance. For example, if BCB is used for the dielectric 65 with a breakdown voltage of 1 MV/cm, and the bias 67 electrodes are set to a potential of 500V, then at least 5 um of BCB are necessary to prevent accidental dielectric 65 breakdown. The thickness of BCB required is now well beyond the thickness used typically for an interlevel dielectric in the TFT industry. Using very thick layers of dielectric 65 requires overcoming integration challenges between the detector element and readout circuit element.

The amorphous silicon MISIM detector element shown in FIG. 6 works well if the bias 67 and sense 66 electrode layers are made thin (e.g. 50-100 nm) to avoid step coverage issues for the follow-on insulator 71 and semiconducting 70 layers. Here, a 5 um thick dielectric 65 layer underneath the MISIM detector element can cause a functional (EQE loss) and reliability (poor connectivity) problem if the via is made in the traditional process with steep sidewall angles. So, to allow for proper continuity and coverage, the via 64 in the Dielectric 65 can have a sloped or angled sidewall. For BCB, an angle of 45 degrees or shallower was discovered to work appropriately for this task although other sidewall angles and sense 66 and bias 67 electrode thickness combinations can also work by proper design.

The photoconductive element implementation shown in FIG. 6 can be mapped onto the pixel circuit shown in FIG. 3, where the transistor gate electrode 63 is connected to the Pixel Gate line 38, the source electrode 61 is connected to the Pixel Data line 36 (see FIG. 3) and the bias electrodes 67 are connected to the Bias node 33. Since the MISIM detector element has an intrinsic internal capacitance between the sense 66 and bias 67 electrodes as discussed earlier, the capacitor 32 shown in FIG. 3 is optional.

One additional challenge with placing the TFT readout circuit element underneath the MISIM detector element is that the normal operating voltage on the bias 67 and/or sense 66 electrodes can influence TFT operation especially if a bottom gate TFT configuration is employed as is the case in FIG. 6. Here, a back gate 75 (e.g. preferentially coupled to the Gate electrode 63 to minimize leakage current) is included to ensure the TFT does not conduct inadvertently due to one of the electrodes on top. If a top gate TFT configuration is employed, the need for the back gate 75 can be mitigated since the top gate will act as an electrostatic shield and prevent the bias 67 or sense 66 electrodes from inadvertently biasing the TFT ON.

To detect X-rays indirectly, the scintillator 15 can be placed on either side of the radiography detector system 14. In the device architecture shown in FIG. 6, the scintillating layer 68 (akin to the scintillator 15) is deposited or placed on top of the MISIM detector element. This is because the semiconducting layer 70 is exposed fully to incident light from the scintillating layer 68 resulting in a higher absorption of incident light and thus, better EQE. If the scintillating layer 68 is deposited or placed on the bottom (i.e. adjacent to the glass 60), then there could be a loss of spatial resolution due to the thickness of the glass 60 and loss in EQE if the electrodes are opaque and block light from reaching the amorphous silicon 70 semiconducting layer. Also, since the photoconductive element disclosed does not use a p+ doped layer like the PIN photodiode, blue light emitting scintillating phosphors can work.

The implementation shown in FIG. 6 uses a bottom gate TFT and a bottom electrode MISIM detector. It should be noted that additional implementations are possible that use a combination of either a top or bottom gate TFT switch and a top or bottom electrode MISIM detector. In addition, it is possible to fabricate the readout circuit element on top of the MISIM detector element for example, using a top electrode MISIM detector and a top gate TFT. Moreover, use of transparent sense 66 and bias 67 electrodes can also enable top and bottom electrode MISIM detectors to be used interchangeably with comparable performance.

What is claimed is:

1. A photoconductive element for a digital imaging system, the photoconductive element comprising:
    a detector element comprising at least one semiconducting layer for absorbing photons, a first electrode coupled to a surface of said semiconducting layer, a second electrode coupled to a surface of said semiconducting layer, wherein said first electrode and said second electrode are separated horizontally, and at least one of said electrodes is electrically isolated from said semiconducting layer by an insulating layer;
    wherein the insulating layer is for reducing dark currents when there are no photons impinging on the semiconducting layer and enables photocurrents to pass through the insulating layer when photons impinge on the semiconducting layer;
    a readout circuit element coupled to said detector element; and
    a dielectric layer between said detector element and said readout circuit element.

2. The photoconductive element of claim 1 wherein said detector element is coupled to said readout circuit element by means of a via in said dielectric layer.

3. The photoconductive element of claim 1 wherein said dielectric layer comprises at least one of amorphous silicon nitride, amorphous silicon oxide, amorphous silicon oxynitride, polyimide, benzocyclobutene (BCB), parylene, acrylic, and polystyrene.

4. The photoconductive element of claim 1 wherein said readout circuit element comprises a transistor switch circuit.

5. The photoconductive element of claim 1 wherein said readout circuit element comprises an active pixel sensor circuit.

6. The photoconductive element of claim 1 further comprising a scintillating phosphor layer for indirectly generating optical photons in response to incident high energy radiation photons.

7. The photoconductive element of claim 1 wherein said semiconducting layer comprises at least one of amorphous silicon, molybdenum sulphide, Indium Gallium Zinc Oxide, polycrystalline silicon, amorphous selenium, mercuric iodide, lead oxide, microcrystalline silicon, nanocrystalline silicon, crystalline silicon, pentacene, PTCBI, CuPc, small molecule organic semiconductor, and polymer organic semiconductor; said insulator layer comprises at least one of amorphous silicon nitride, amorphous silicon oxide, amorphous silicon oxynitride, polyimide, benzocyclobutene (BCB), parylene and polystyrene.

8. The photoconductive element of claim 1 wherein at least one of said electrodes is transparent.

9. A method for providing a photoconductive element for a digital imaging system, the method comprising:
providing a detector element comprising at least one semiconducting layer for absorbing photons, a first electrode coupled to a surface of said semiconducting layer, a second electrode coupled to a surface of said semiconducting layer, wherein said first electrode and said second electrode are separated horizontally, and at least one of said electrodes is electrically isolated from said semiconducting layer by an insulating layer;
wherein the insulating layer is for reducing dark currents when there are no photons impinging on the semiconducting layer and enables photocurrents to pass through the insulating layer when photons impinge on the semiconducting layer;
providing a readout circuit element coupled to said detector element; and
providing a dielectric layer between said detector element and said readout circuit element.

10. The method of claim 9 wherein said detector element is coupled to said readout circuit element by means of a via in said dielectric layer.

11. The method of claim 9 wherein said readout circuit element utilizes a transistor switch circuit.

12. The method of claim 9 wherein said readout circuit element utilizes an active pixel sensor circuit.

13. A radiography detector system comprising:
a plurality of photoconductive elements, each of the plurality of photoconductive elements including a detector element comprising at least one semiconducting layer for absorbing photons, a first electrode coupled to a surface of said semiconducting layer, a second electrode coupled to a surface of said semiconducting layer, wherein said first electrode and said second electrode are separated horizontally, and at least one of said electrodes is electrically isolated from said semiconducting layer by an insulating layer;
wherein the insulating layer is for reducing dark currents when there are no photons impinging on the semiconducting layer and enables photocurrents to pass through the insulating layer when photons impinge on the semiconducting layer;
a readout circuit element coupled to said detector element; and
a dielectric layer between said detector element and said readout circuit element;
a row switching control driving a plurality of pixel gate lines;
a charge amplifier circuit coupled to a plurality of pixel data lines; and
a multiplexer, digitizer, memory, and control logic circuit.

14. The system of claim 13 wherein said detector element is coupled to said readout circuit element by means of a via in said dielectric layer.

15. The system of claim 13 wherein said dielectric layer comprises at least one of amorphous silicon nitride, amorphous silicon oxide, amorphous silicon oxynitride, polyimide, benzocyclobutene (BCB), parylene, acrylic, and polystyrene.

16. The system of claim 13 wherein said readout circuit element comprises a transistor switch circuit.

17. The system of claim 13 wherein said readout circuit element comprises an active pixel sensor circuit.

18. The system of claim 13 further comprising a scintillating phosphor layer for indirectly generating optical photons in response to incident high energy radiation photons.

19. The system of claim 13 wherein said semiconducting layer comprises at least one of amorphous silicon, molybdenum sulphide, Indium Gallium Zinc Oxide, polycrystalline silicon, amorphous selenium, mercuric iodide, lead oxide, microcrystalline silicon, nanocrystalline silicon, crystalline silicon, pentacene, PTCBI, CuPc, small molecule organic semiconductor, and polymer organic semiconductor; said insulator layer comprises at least one of amorphous silicon nitride, amorphous silicon oxide, amorphous silicon oxynitride, polyimide, benzocyclobutene (BCB), parylene, acrylic and polystyrene.

20. The system of claim 13 wherein at least one of said electrodes is transparent.

* * * * *